(12) United States Patent
Bruno et al.

(10) Patent No.: US 7,279,993 B2
(45) Date of Patent: Oct. 9, 2007

(54) PHASE-LOCKED LOOP

(75) Inventors: Angela Bruno, Catania (IT); Giovanni Cali', Catania (IT); Antonio Palleschi, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 89 days.

(21) Appl. No.: 11/239,654

(22) Filed: Sep. 29, 2005

(65) Prior Publication Data
US 2006/0071719 A1 Apr. 6, 2006

(30) Foreign Application Priority Data
Sep. 29, 2004 (EP) ................... 04425728

(51) Int. Cl.
*H03L 7/00* (2006.01)
*H03L 7/06* (2006.01)
(52) U.S. Cl. .................. 331/34; 331/16; 331/25; 331/1 A; 327/156; 327/157
(58) Field of Classification Search ............ 331/11–18, 331/25, 34, 1 A; 327/156; 341/143; 332/127, 332/128
See application file for complete search history.

(56) References Cited

U.S. PATENT DOCUMENTS 3,781,685 A * 12/1973 Ching ................. 375/245
4,316,151 A * 2/1982 Ooms .................. 331/1 A
6,249,685 B1   6/2001 Sharaf et al. ............ 455/550
6,308,049 B1 * 10/2001 Bellaouar et al. .......... 455/76

FOREIGN PATENT DOCUMENTS

EP     0 147 307 A2    7/1985

* cited by examiner

*Primary Examiner*—Robert Pascal
*Assistant Examiner*—Ryan J Johnson
(74) *Attorney, Agent, or Firm*—Lisa K. Jorgenson; Robert Iannucci; Seed IP Law Group PLLC

(57) ABSTRACT

A phase-locked loop includes an oscillator, a phase detector coupled to the oscillator, a charge pump coupled to the phase detector, a filter coupled to the charge pump, a voltage controlled oscillator, and a fractional frequency divider. The voltage controlled oscillator sends a VCO signal to the divider which sends an output signal to the phase detector. The divider comprises a prescaler that divides the VCO signal by an integer number and the divider emits a first signal representing the result of the division. The phase-locked loop comprises an accumulator coupled to the divider and a digital-analog converter that receives the first signal and outputs a DAC signal aligned with the first signal. The phase-locked loop comprises a circuit coupled to the digital-analog converter and to the prescaler to synchronize the DAC signal with a signal output from the prescaler.

18 Claims, 4 Drawing Sheets

PHASE-LOCKED LOOP

BACKGROUND OF THE INVENTION

1. Field of the Invention

The present invention refers to a phase-locked loop.

2. Description of the Related Art

The use of transmitters and receivers using phase-locked loops (PLL) based on frequency synthesizers in modern plants of radio frequency telecommunications is generally known. Several critical parameters for the frequency synthesizers used in applications of telecommunications are the switching time, the phase noise and other.

A low phase noise and a high switching speed are obtained with fractional synthesizers. A typical PLL based on a fractional frequency synthesizer at N, with N an integer number, is shown in FIG. 1. Said PLL comprises a crystal oscillator 1 that supplies an oscillation frequency to a reference divider 2 to obtain a reference frequency fr1. The latter is in input to a phase detector (PD) 3 that also has in input a frequency fv1 coming from a fractional divider 4. The signals in output from the phase detector are in input to a charge pump 5 whose output is connected to a filter 6 from which the direct current for driving a voltage controlled oscillator VCO 7 arrives; the frequency fo1 in output from the VCO is in input to the fractional divider 4 capable of switching from a division by N to a division by N+1, with N an integer number. The PLL also comprises an L-bit accumulator 8, with L an integer number, that is increased continuously by a quantity x1 on the reference ratio given by the maximum count m with $m=2^L$; the accumulator 8 acts on the fractional divider 4 like a binary adder at L-bit with status registers having as addends the previous status and x1, with x1=0, 1, 2, . . . m−1. The accumulator 8 permits the scattering of the periods of division by N and N+1 to attenuate the spurious harmonics produced by the divider 4. The frequency fo is divided in x1/m fractions of the reference frequency fr1, that is fo=Nf*fr1 where Nf=N+x1/m with x1=0, 1, 2, . . . m−1; the ratio x/m represents the fractional part of Nf. The divider 4 will divide by N when the accumulator is increasing up to the maximum count m−1 and divide by N+1 when it exceeds the count m−1.

A disadvantage of the above mentioned type of frequency synthesizers lies in the phase ripple present on the output of the phase detector that gives rise to a current Icp1 of the PWM type. If said current is not compensated for, an energy in sideband on the output spectrum of the VCO is produced that is considered the greatest problem for such synthesizers.

One way to compensate for the current Icp1 is carried out by the PLL of FIG. 2. In this case the phase ripple PWM is proportional and synchronized to the contents of the L-bit accumulator 8 and can be used to control the width of the compensation pulse in sideband. The PLL of FIG. 2 comprises, in addition to the elements of the PLL of FIG. 1, a fractional synchronization circuit 11, a fractional charge pump 12 and a digital-analog converter (DAC) 13. The fractional pulses, which are controlled on a constant ratio, have constant width and their height is modulated. The content of the accumulator 8 feeds the DAC 13 and is used to modulate the width of the compensation current Icomp1 generated by the fractional pump 12. The circuit 11 operates at a frequency fixed by the crystal 1, is controlled by the signal fv coming from the main divider 7, and produces the fractional compensation pulse at fixed width that controls the charge pump 12. The pulse amplitude modulation (PAM) signal in output from the pump 12 is adapted to cancel the PWM spurious signals coming from the charge pump 4. Nevertheless in this manner optimum compensation of the current Icp is not obtained, that is, there is not a total cancellation of the spurious signals coming from the charge pump 4.

BRIEF SUMMARY OF THE INVENTION

One embodiment of the present invention provides a phase-locked loop that overcomes the above mentioned drawback.

One embodiment of the present invention is a phase-locked loop comprising an oscillator, a phase detector having in input a signal proportional to the signal in output from the oscillator, a charge pump having in input the signal in output from the phase detector, a filter coupled with the charge pump, a voltage controlled oscillator and a fractional frequency divider, the voltage controlled oscillator being coupled with the filter and sending an output signal to the fractional frequency divider, the fractional frequency divider being adapted to send an output signal to the phase detector. The phase-locked loop includes a digital-analog converter coupled with the charge pump and with the filter, an accumulator coupled with the fractional frequency divider and with the digital-analog converter. The fractional frequency divider includes a prescaler adapted to divide the signal in input by an integer number P or by the integer number P+1, the fractional frequency divider emitting a first representative signal of the division by P or by P+1 of the prescaler. The first signal is in input to the digital-analog converter so that the signal in output from the digital-analog converter is aligned to the first signal. The phase-locked loop also includes a circuit coupled to the digital-analog converter and to the prescaler to synchronize the signal in output from the digital-analog converter with the signal in output from the prescaler.

The phase-locked loop can be produced that is capable of canceling the spurious signals coming from the charge pump at PWM at every instant.

BRIEF DESCRIPTION OF THE SEVERAL VIEWS OF THE DRAWING

The characteristics and advantages of the present invention will appear evident from the following detailed description of an embodiment thereof, illustrated as non-limiting example in the enclosed drawings, in which.

DETAILED DESCRIPTION OF THE INVENTION

Figure 3:
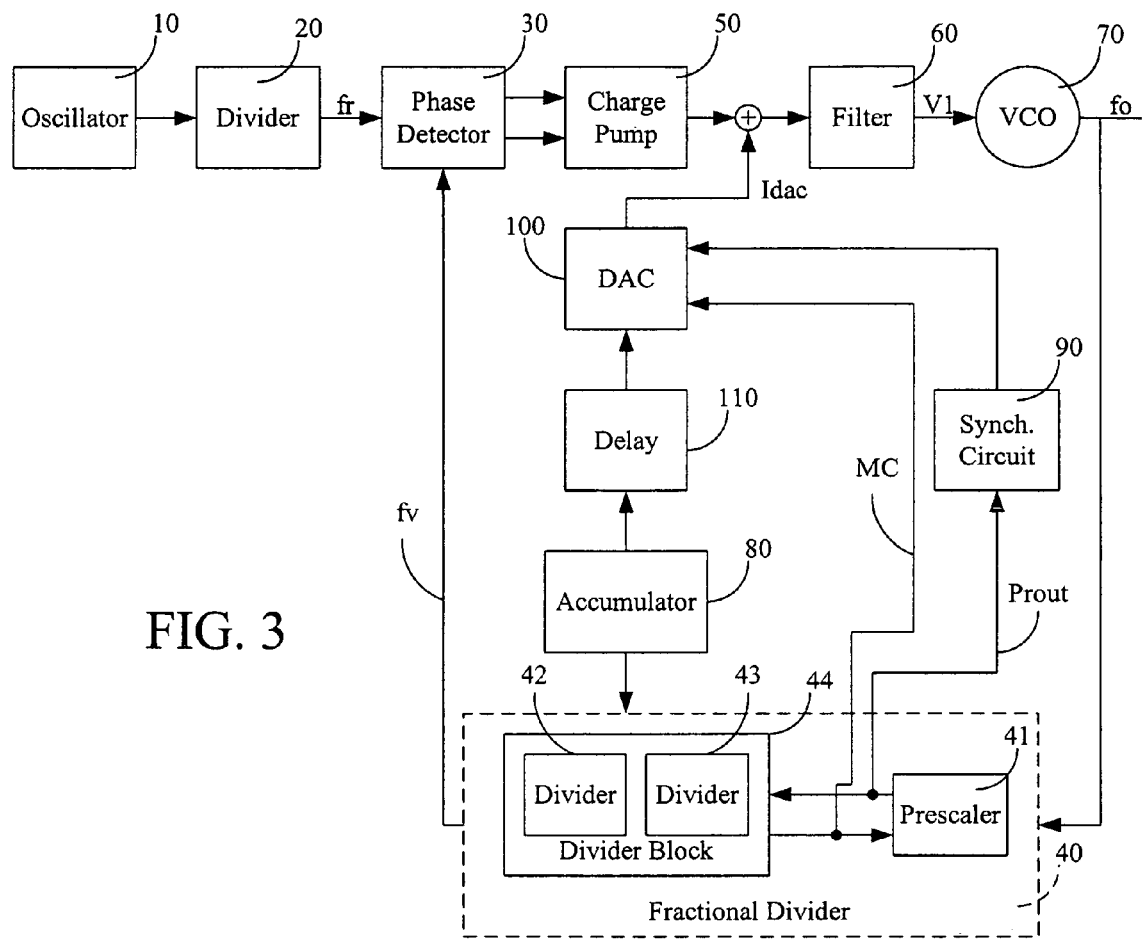
FIG. 3 is a diagram of a phase-locked loop according to the present invention.

With reference to FIG. 3 a phase-locked loop according to the present invention is shown. Said circuit comprises a crystal oscillator 10 that supplies an oscillation frequency to a reference divider 20 to obtain a reference frequency fr. The latter is in input to a phase detector (PD) 30 that also has in input a frequency fv coming from a fractional divider 40. The signals in output from the phase detector 30 are in input to a charge pump 50 whose output is in input to a filter 60 from which the direct current for driving the voltage controlled oscillator VCO 70 arrives. The frequency fo in output from the VCO is in input to the fractional divider 40 capable of switching from a division by N to a division by N+1, with N being an integer number. The divider 40 is made up of a programmable divider comprising a prescaler 41 and a group 44 of two divider circuits: a first divider circuit 42 adapted to dividing by A and a second divider circuit 43 adapted to dividing by B with A and B integer numbers; the dividers 42 and 43 are used to generate a division by N with N being an integer number greater than the integer number P. The prescaler 41 has in input the frequency fo coming from the VCO 70 and sends to the group of dividers 42 and 43 a signal Prout that is proportional to P or P+1 so as to generate such a division that N=(P+1)*A+P*(B−A)=P*B+A with P an integer number and less than N. The group of dividers 42 and 43 sends a signal MC to the prescaler 41 that is indicative of the division by P or by P+1.

The PLL also comprises an L-bit accumulator 80, with L a whole number, that is increased continuously by a quantity x1 on the reference ratio given by the maximum count m with m=$2^L$; the accumulator 80 acts on the fractional divider 40 as a binary adder at L-bit with status registers having as addends the previous status and x1, with x1=0, 1, 2, ... m−1. The accumulator 80 permits the scattering of the periods of division by N and N+1 to attenuate the spurious harmonics produced by the divider 40. The frequency fo is divided into x1/m fractions of the reference frequency fr1, that is fo=Nf*fr1 where Nf=N+x1/m with x1=0, 1, 2, ... m−1; the ratio x/m represents the fractional part of Nf. The divider 40 will divide by N when the accumulator is increasing up to the maximum count m−1 and will divide by N+1 when it exceeds the count m−1.

The output signal Prout of the prescaler 41 is in input to a synchronizing circuit 90 that is adapted to create an enabling pulse of the DAC 100. The duration of the pulse is J*T where J is a parameter set by the project and T is the period of time in which the prescaler 41 divides by P or by P+1. The period of time T is not constant, in fact it can be given by P*To or (P+1)*To where To is the inverse of the frequency of coming from the VCO 70.

The charge Qpwm of the PWM charge pump 50 that is compensated for is given by Qpwm=Icp/(m*fo) where Icp is the current due to the charge pump and 1/(m*fo) is the duration; the charge Qpwm has the expression seen above in the case in which it is calculated for a less significant bit (lsb), that is in the case in which the status of the accumulator 80 is Sx=1, but generally the charge Qpwm depends on the status Sx of the accumulator 80. The current Icp is the current that is generated by the spurious harmonics present in a phase-locked loop that uses a fractional divider.

The current Ipam in output from the DAC 100 has to compensate the current Icp; the charge Qpam is given by Qpam=Ipam*T. From the equation of the charges we obtain:

$$Ipam = \frac{Icp \times To}{m \times J \times T}.$$

Given that T is variable from P*To to (P+1)*To we have that the current Ipam will vary between a minimum and a maximum; we will have respectively:

$$Ipam_{min} = \frac{Icp}{m \times J \times (P+1)} \text{ and } Ipam_{max} = \frac{Icp}{m \times J \times P}.$$

The current Ipam depends on the status Sx of the accumulator, therefore the current in output from the DAC 100 is a current Idac=Ipam*Sx where the status of the accumulator Sx=Sx−1+x is between 0 and m−1.

The DAC 100 has the enabling pulse signal in input coming from the circuitry 90 and a signal MC coming from the group of counters 42 and 43; the signal MC indicates when the prescaler divides by P or by P+1. In a similar manner the current in output from the DAC 100 is aligned to the signal MC, in fact it assumes two different values, that is:

$$Idac1 = \frac{Icp}{m \times J \times P} \times Sx \text{ when the prescaler divides by } P^*To \text{ and}$$

$$Idac2 = \frac{Icp}{m \times J \times (P+1)} \times Sx \text{ when the prescaler divides by } To^*(P+1).$$

If we consider the more general case of a compensation by means of the DAC 100 where for a number of periods equal to J there will be a number W of times in which the prescaler 41 divides by P+1 and a number J−W of times in which the prescaler 41 divides by P. We can write the complete expression of the charge that the DAC 100 has to inject as:

$$Qdac = \frac{Icp}{m \times J \times (P+1)} \times W \times (P+1)To + \frac{Icp}{m \times J \times P} \times (J-W) \times P \times To$$

from which $$Qdac = \frac{Icp}{m \times fo}$$

is obtained therefore we have Qpwm=Qdac that is a complete cancellation of the spurious harmonics under every condition.

Figure 4:
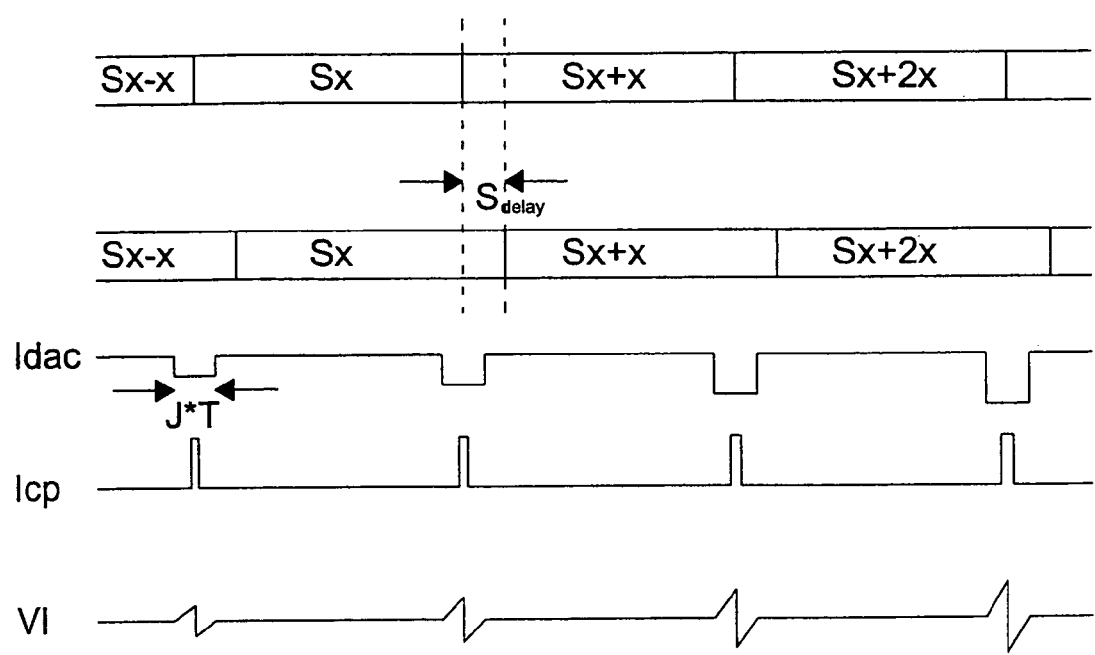
FIG. 4 is a graph in function of the time of the signals detected in various points of the circuit of FIG. 3.

FIG. 4 shows time diagrams relating to the devices present in the phase-locked loop of FIG. 3. In FIG. 4 the various states of the accumulator 80 Sx−x, Sx, Sx+x, Sx+2x are shown; the state Sx+x is delayed by a Sdelay in the input to the DAC 100 by means of the delay device 110 whose function is to avoid switching on the current Idac during the change of status of the accumulator 80. FIG. 4 shows the current Icp in output from the charge pump 5 and the compensation current Idac in output from the DAC 100. In FIG. 4 the voltage Vl in output from the filter 60 is also present in which the effect of the current Icp and the compensation of the current Idac can be noted.

Figure 1:
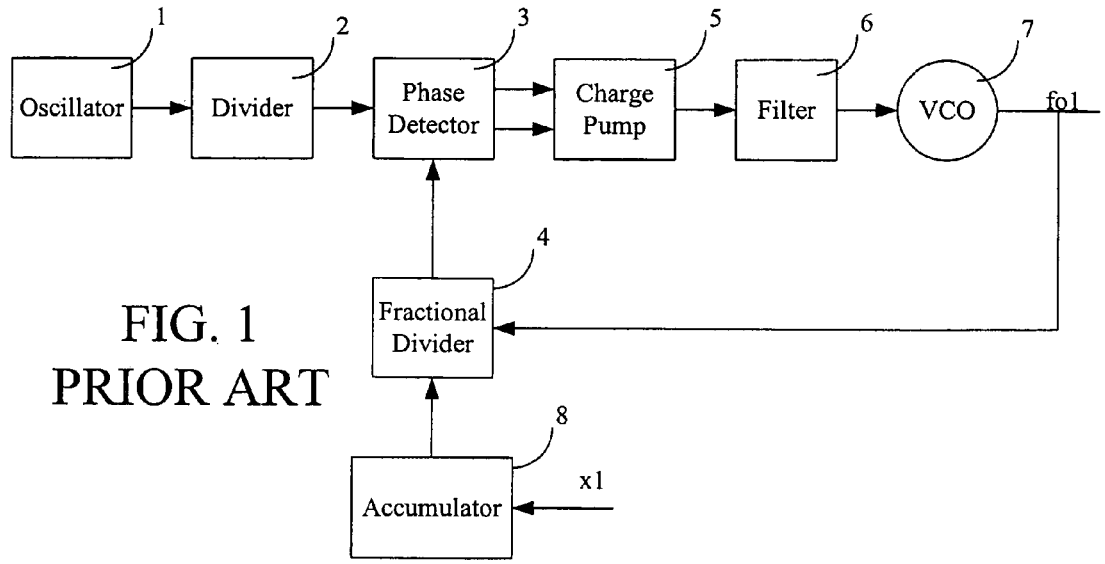
FIG. 1 is a diagram of a phase-locked loop according to the known art.
Figure 2:
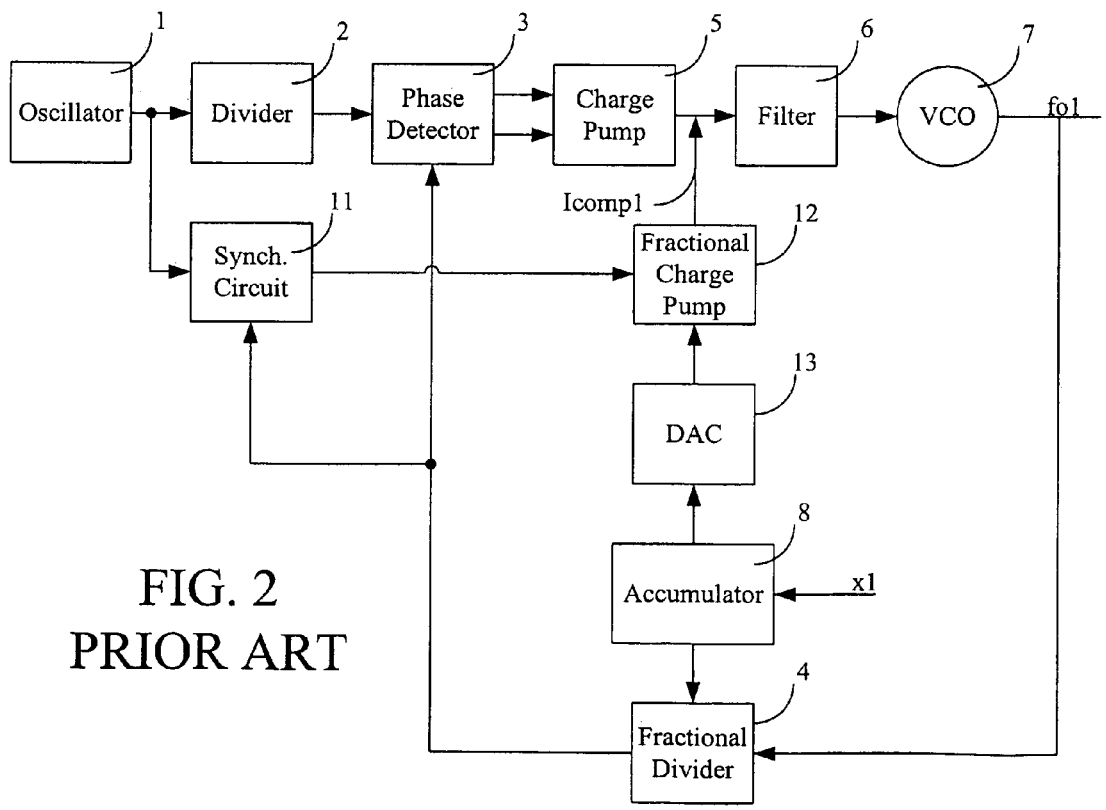
FIG. 2 is a diagram of another phase-locked loop according to the known art.
Figure 5:
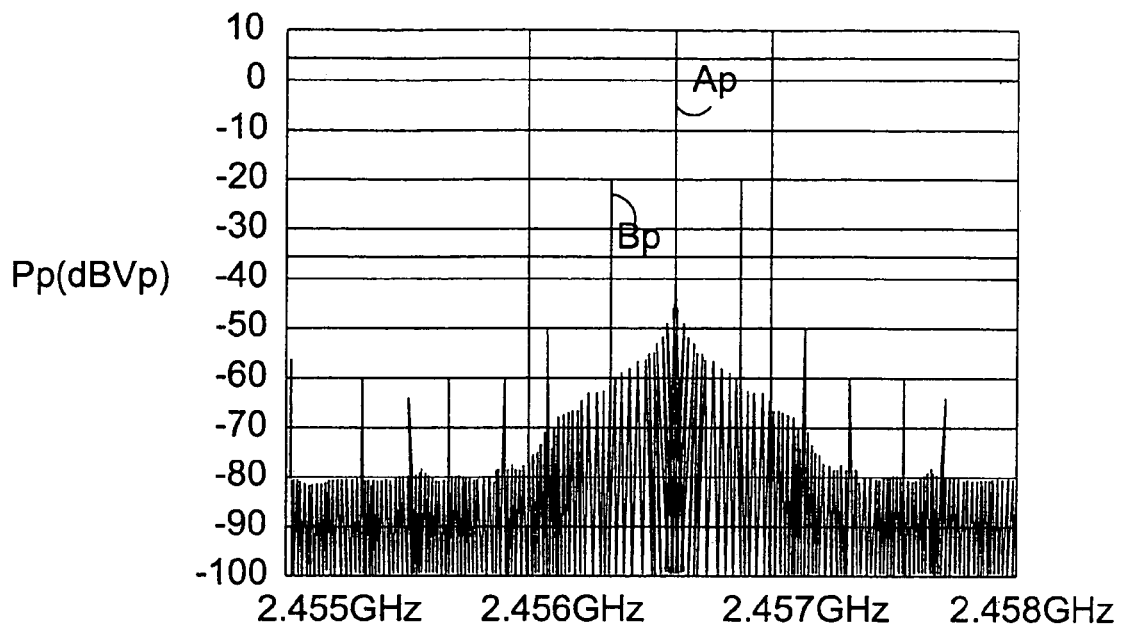
FIG. 5 is a graph of the levels of powers referred to the spurious harmonics and to the fundamental frequency deriving from a simulation on the circuit of FIG. 2.

FIG. 5 shows the graph of the power levels Pp in dBVp (decibels per volt peak-peak) referred to the spurious harmonics Bp and to the fundamental frequency Ap deriving from a simulation on the circuit of FIG. 2 selecting m=8 and x1=1. It can be noted that the power referred to the fundamental harmonic Ap is 3.4 dBVp while that referred to the greater spurious harmonic Bp is −34.2 dBVp.

Figure 6:
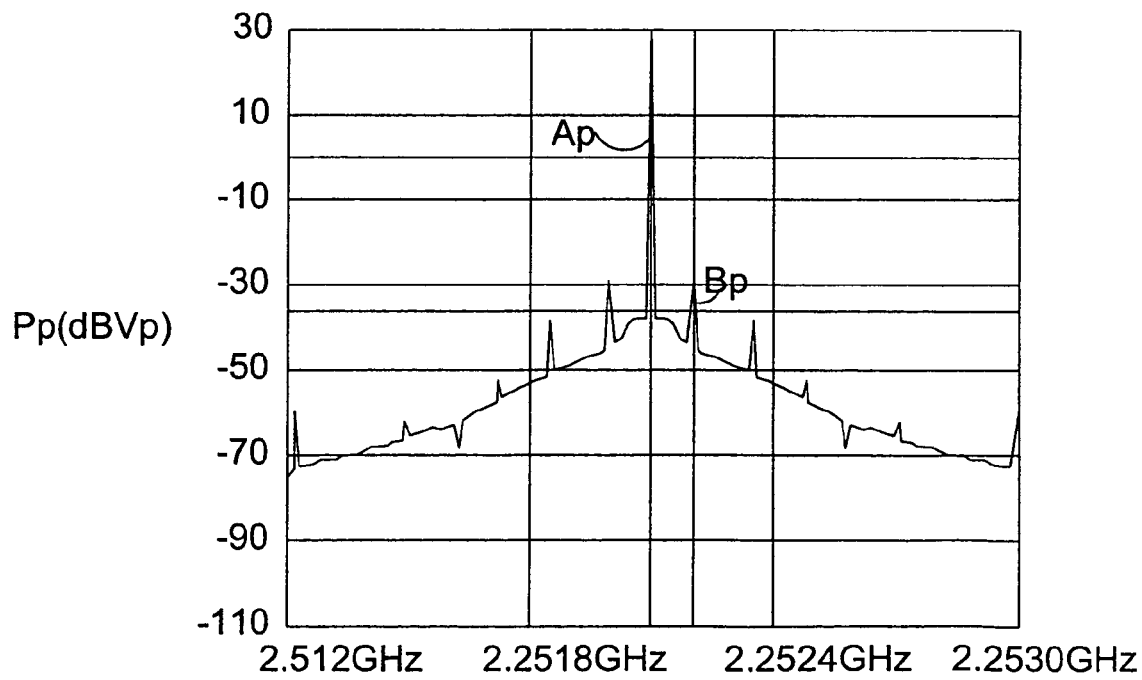
FIG. 6 is a graph of the levels of powers referred to the spurious harmonics and to the fundamental frequency deriving from a simulation on the circuit of FIG. 3.

FIG. 6 shows the graph of the power levels Pp in dBVp (decibel per volt peak-peak) referred to the spurious harmonics Bp and to the fundamental frequency Ap deriving from a simulation on the circuit of FIG. 3 selecting m=8 and x=1. Note that the power of the fundamental frequency is 3.4 dBVp while that referred to the greater spurious harmonic Bp is 37.4 dBVp, therefore the level of power Bp referred to the spurious harmonic is lower for the circuit of FIG. 3 in comparison to that of the circuit of FIG. 2.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A phase-locked loop, comprising:
an oscillator that outputs an oscillator signal;
a phase detector having an input that receives a signal proportional to the oscillator signal and having an output that provides a phase detector signal;
a charge pump having an input that receives the phase detector signal from said phase detector;
a filter coupled to said charge pump;
a voltage controlled oscillator coupled to said filter and structured to produce a VCO signal;
a fractional frequency divider coupled to receive the VCO signal, said fractional frequency divider being structured to send an frequency divider signal to said phase detector, said fractional frequency divider comprising a prescaler structured to divide the VCO signal by an integer number P or by an integer number P+1 and output a prescaler signal, said fractional frequency divider emitting a first signal representative of the division by P or by P+1;
a digital-analog converter coupled to said charge pump, said filter, and said fractional frequency divider, the digital-analog converter having an input that receives said first signal and an output that provides a DAC signal that is aligned to said first signal;
an accumulator coupled to said fractional frequency divider and with said digital-analog converter; and
a synchronizing circuit coupled to said digital-analog converter and to said prescaler and structured to synchronize the DAC signal output from the digital-analog converter with the prescaler signal output from the prescaler.

2. The phase-locked loop according to claim 1, wherein said accumulator is an L-bit accumulator.

3. The phase-locked loop according to claim 1, wherein said oscillator is a fixed frequency crystal.

4. The phase-locked loop according to claim 1, wherein said fractional divider comprises a circuit block comprising first and second dividers, the prescaler signal output by said prescaler being coupled with said circuit block and an output of said circuit block being coupled to an input of said prescaler and providing the first signal to said digital-analog converter.

5. The phase-locked loop according to claim 1, wherein said synchronizing circuit is structured to generate an enabling pulse signal to said digital-analog converter having a duration variable between P and P+1 times a period of time given by an inverse of the VCO signal output from the voltage controlled oscillator.

6. The phase-locked loop according to claim 1, further comprising a delay device coupled to said digital-analog converter and to said accumulator.

7. A phase-locked loop, comprising:
an oscillator that outputs an oscillator signal;
a phase detector having an input that receives a signal proportional to the oscillator signal and having an output that provides a phase detector signal;
a charge pump having an input that receives the phase detector signal;
a voltage controlled oscillator coupled to the charge pump and structured to produce a VCO signal;
a fractional frequency divider coupled to receive the VCO signal, the fractional frequency divider being structured to send an frequency divider signal to the phase detector, the fractional frequency divider comprising a prescaler structured to divide the VCO signal by an integer number P, the fractional frequency divider emitting a first signal indicative of the division by the prescaler;
a digital-analog converter coupled to the charge pump and the fractional frequency divider, the digital-analog converter having an input that receives the first signal and an output that provides a DAC signal that is aligned with the first signal, wherein the prescaler is structured to output a prescaler signal proportional to P; and
a synchronizing circuit coupled to the digital-analog converter and the prescaler and structured to synchronize the DAC signal output from the digital-analog converter with the prescaler signal output from the prescaler.

8. The phase-locked loop of claim 7, wherein the synchronizing circuit is structured to generate an enabling pulse signal to the digital-analog converter having a duration variable between P and P+1 times a period of time given by an inverse of the VCO signal output from the voltage controlled oscillator.

9. The phase-locked loop of claim 7, further comprising an accumulator coupled to the digital-analog converter and the fractional frequency divider, the accumulator being structured to attenuate spurious harmonics produced by the fractional frequency divider.

10. The phase-locked loop of claim 9, further comprising a delay device coupled between the accumulator and the digital-analog converter and structured to cause the digital-analog converter to avoid switching during a change of status of the accumulator.

11. The phase-locked loop of claim 7, wherein the fractional divider comprises a circuit block including an input, first and second dividers, and an output, the input being coupled to an output of the prescaler and the output of the circuit block being coupled to an input of the prescaler and providing the first signal to the digital-analog converter.

12. The phase-locked loop of claim 7, further comprising a filter coupled between the charge pump and the voltage controlled oscillator.

13. The phase-locked loop of claim 7 wherein the fractional divider is a programmable divider structured to switch from a division by an integer N to a division by N +1.

14. A phase-locked loop, comprising:
an oscillator that outputs an oscillator signal;
a phase detector coupled to the oscillator signal and having an output that provides a phase detector signal;
a charge pump having an input that receives the phase detector signal;
a voltage controlled oscillator coupled to the charge pump and structured to produce a VCO signal;
a fractional frequency divider coupled to receive the VCO signal, the fractional frequency divider being structured to send a first frequency divider signal to the phase detector and output a second frequency divider signal;
a digital-analog converter coupled to the fractional frequency divider and the charge pump, the digital-analog converter having an input that receives the second frequency divider signal and an output that provides a DAC signal that is aligned with the second frequency divider signal, wherein the fractional frequency divider is structured to output a prescaler signal proportional to P; and
a synchronizing circuit coupled to the digital-analog converter and the fractional frequency divider and structured to synchronize the DAC signal output from the digital-analog converter with the prescaler signal output from the prescaler.

15. The phase-locked loop of claim 14, wherein the synchronizing circuit is structured to generate an enabling pulse signal to the digital-analog converter having a duration variable between P and P+1 times a period of time given by an inverse of the VCO signal output from the voltage controlled oscillator.

16. The phase-locked loop of claim 14, further comprising an accumulator coupled to the digital-analog converter and the fractional divider, the accumulator being structured to attenuate spurious harmonics produced by the fractional frequency divider.

17. The phase-locked loop of claim 16, further comprising a delay device coupled between the accumulator and the digital-analog converter and structured to cause the digital-analog converter to avoid switching during a change of status of the accumulator.

18. The phase-locked loop of claim 14, wherein the fractional frequency divider comprises a prescaler and a circuit block including an input, first and second dividers, and an output, the input being coupled to an output of the prescaler and the output of the circuit block being coupled to an input of the prescaler and providing the second frequency divider signal to the digital-analog converter.

* * * * *